(12) United States Patent
Wilson (10) Patent No.: US 10,113,245 B2
(45) Date of Patent: Oct. 30, 2018

(54) ELECTROPLATING CONTACT RING WITH RADIALLY OFFSET CONTACT FINGERS

(71) Applicant: APPLIED Materials, Inc., Santa Clara, CA (US)

(72) Inventor: Gregory J. Wilson, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/447,458

(22) Filed: Mar. 2, 2017

(65) Prior Publication Data

US 2017/0275776 A1 Sep. 28, 2017

Related U.S. Application Data

(60) Provisional application No. 62/313,052, filed on Mar. 24, 2016.

(51) Int. Cl.
| | |
|---|---|
| *C25D 17/00* | (2006.01) |
| *C25D 5/02* | (2006.01) |
| *C25D 5/56* | (2006.01) |
| *C25D 7/12* | (2006.01) |
| *H01L 21/288* | (2006.01) |
| *H01R 4/48* | (2006.01) |
| *H01R 39/18* | (2006.01) |
| *H01R 39/64* | (2006.01) |

(52) U.S. Cl.
CPC .......... *C25D 17/005* (2013.01); *C25D 5/022* (2013.01); *C25D 5/56* (2013.01); *C25D 7/123* (2013.01); *C25D 17/001* (2013.01); *H01L 21/2885* (2013.01); *H01R 4/48* (2013.01); *H01R 39/18* (2013.01); *H01R 39/64* (2013.01)

(58) Field of Classification Search
USPC .......................................................... 118/500
See application file for complete search history.

(56) References Cited

U.S. PATENT DOCUMENTS

| | | |
|---|---|---|
| 5,737,178 A | 4/1998 | Herchen |
| 6,529,362 B2 | 3/2003 | Herchen |
| 6,843,897 B2 | 1/2005 | Herchen et al. |
| 6,855,235 B2 | 2/2005 | Herchen et al. |
| 6,869,516 B2 | 3/2005 | Lubomirsky et al. |
| 6,875,331 B2 | 4/2005 | Herchen |
| 7,025,862 B2 | 4/2006 | Herchen et al. |
| 7,087,144 B2 | 8/2006 | Herchen |
| 7,285,195 B2 | 10/2007 | Herchen |

(Continued)

OTHER PUBLICATIONS

International Search Report and Written Opinion of International Application No. PCT/US2017/022981; dated Jun. 26, 2017; 16 pages.

*Primary Examiner* — Stefanie S Wittenberg
(74) *Attorney, Agent, or Firm* — Perkins Coie LLP; Kenneth H. Ohriner (57) ABSTRACT

A contact ring for an electroprocessor has redundant contact fingers, i.e., more contact fingers than needed for contacting a very narrow edge exclusion zone on a substrate such as a semiconductor wafer. The contact fingers have slightly different lengths so that they extend to different radial positions. By providing redundant contact fingers, and by slightly varying the lengths of the contact fingers, a sufficient number of contact fingers make contact with the electrically conductive surface in the edge exclusion zone to provide good electroplating results.

6 Claims, 6 Drawing Sheets

(56) References Cited

U.S. PATENT DOCUMENTS

| | | |
|---|---|---|
| 2002/0144900 A1 | 10/2002 | Keigler |
| 2004/0035694 A1 | 2/2004 | Batz, Jr. et al. |
| 2004/0069651 A1 | 4/2004 | Herchen et al. |
| 2004/0118697 A1 | 6/2004 | Wen et al. |
| 2005/0000818 A1 | 1/2005 | Graham et al. |
| 2006/0237308 A1 | 10/2006 | Herchen |
| 2013/0146447 A1 | 6/2013 | Wilson et al. |
| 2015/0218726 A1 | 8/2015 | Feng et al. |
| 2016/0204021 A1* | 7/2016 | Coxon ............. H01L 21/67115 62/259.2 |

* cited by examiner

ELECTROPLATING CONTACT RING WITH RADIALLY OFFSET CONTACT FINGERS

PRIORITY CLAIM

This application claims priority to U.S. Patent Application No. 62/313,052, filed Mar. 24, 2016.

BACKGROUND OF THE INVENTION

Electroplating and electropolishing of microelectronic workpieces, such as silicon wafers, typically involves immersing an electrically conductive surface of the wafer into a bath of liquid electrolyte. Electric current is passed through the electrolyte causing metal ions in the electrolyte to plate out onto the surface of the wafer, forming a plated layer or film. The electrical connection to the electrically conductive surface of the wafer may only be made in the so-called edge exclusion zone, as specified by industry standards. The edge exclusion zone is narrow, typically about 3 mm under current industry standards, and 2 mm or less in proposed future industry standards. In the past, contact rings having multiple spring-like contact fingers have been successfully used to provide the electrical connection to the wafer in the edge exclusion zone when processing standard wafers.

Newer wafer level packaging (WLP) applications use a mask design providing the equivalent width of an edge exclusion zone of as little as 0.1 mm (100 microns). To make contact in such a narrow zone requires that the photoresist placement (i.e. centering on the wafer), the wafer size, the wafer centering in the contact ring, the manufacture of the contact fingers, etc. must hold a tolerance within 0.1 mm to make good electrical contact all the way around the circumference of the wafer. If the contact fingers only touch the exposed seed layer on portions of the circumference, then poor electrical contact will cause poor plating uniformity reducing device yield. It is of course very difficult to provide an electroplating apparatus where all of the contact fingers can consistently contact a 0.1 mm edge exclusion zone.

In a similar WLP plating application, a wafer is sawed into individual dies which are tested to identify and discard defective dies. Then, only known good dies are placed into a molding compound layer on a substrate for further processing, essentially as a re-constituted wafer. In this way, only known good die are moved further in the manufacturing process. Use of re-constituted wafers also allows different types of dies to be placed next to each other with electrical connections between them made in subsequent processing steps. This approach is also beneficial for some manufacturing process such as multi-layer RDL (redistribution layer) Fan-Out. Generally, the molding compound layer on the re-constituted wafer results in a very small edge exclusion zone, of the order of about 0.1 mm. In addition, some manufacturing processes, for example multi-layer RDL, may involve wafers where the edge exclusion is different on each layer. These factors present engineering challenges in designing electroplating apparatus.

SUMMARY OF THE INVENTION

A contact ring has redundant contact fingers, i.e., more contact fingers than needed for contacting a very narrow edge exclusion zone. The contact fingers may have slightly different lengths so that they extend to different radial positions. By providing redundant contact fingers, and by slightly varying the lengths of the contact fingers, a sufficient number of contact fingers make contact with the electrically conductive surface in the edge exclusion zone to provide good electroplating results. Although some contact fingers will generally miss the edge exclusion zone, electroplating is not affected. The contact ring compensates for manufacturing tolerances of an exposed seed layer region, and the manufacturing tolerance of the contact ring contact itself.

DETAILED DESCRIPTION

Figure 1:
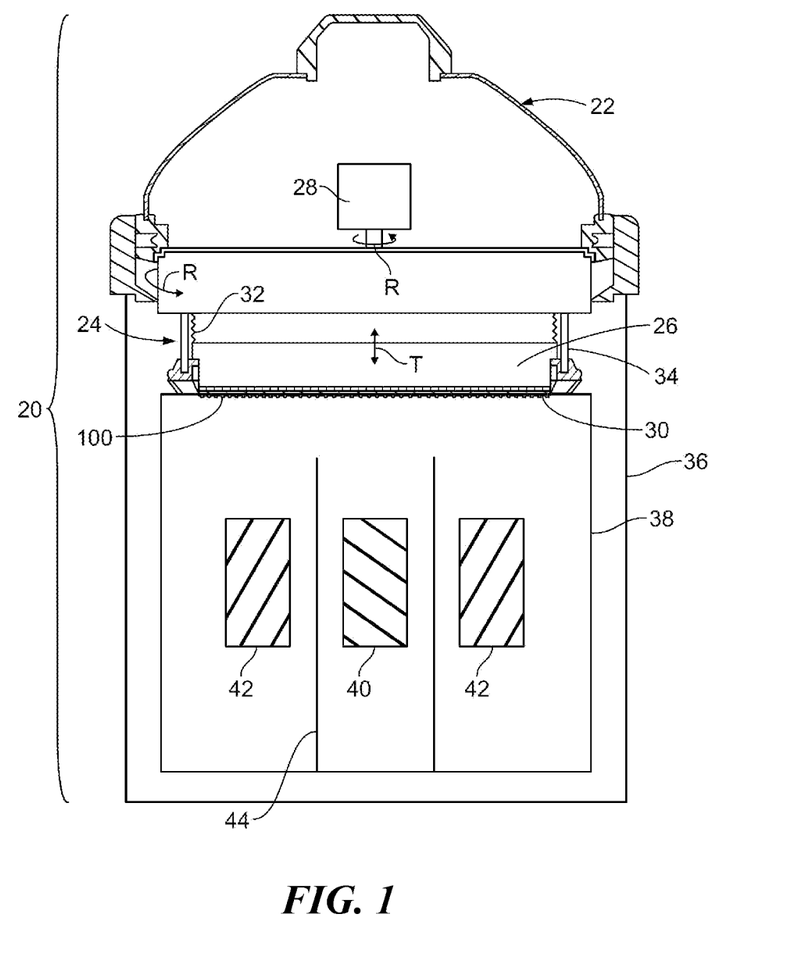
FIG. 1 is a schematic diagram of an electroplating processor.

As shown in FIG. 1, and electroplating processor 20 has a head 22 including a rotor 24. A motor 28 in the head 22 rotates the rotor 24, as indicated by the arrow R in FIG. 1. An annular contact ring 30 on or attachable to the rotor 24 makes electrical contact with a wafer 100 held into or onto the rotor 24. The rotor 24 may include a backing plate 26, and ring actuators 34 for moving the contact ring 30 vertically (in the direction T in FIG. 1 between a wafer load/unload position and a processing position. The head 22 may include bellows 32 to allow for vertical or axial movement of the contact ring while sealing internal head components from process liquids and vapors.

Referring still to FIG. 1, the head 22 is engaged onto a frame 36. A vessel or bowl 38 within the frame 36 holds electrolyte. The head is movable to position a wafer 100 held in the rotor 24 into contact with electrolyte in the vessel 38. One or more electrodes are positioned in the vessel. The example shown in FIG. 1 has a center electrode 40 and a single outer electrode 42 surrounding and concentric with the center electrode 40. The electrodes 40 and 42 may be provided in a di-electric material field shaping unit 44 to set up a desired electric field and current flow paths within the processor 20. Various numbers, types and configurations of electrodes may be used.

Figure 2:
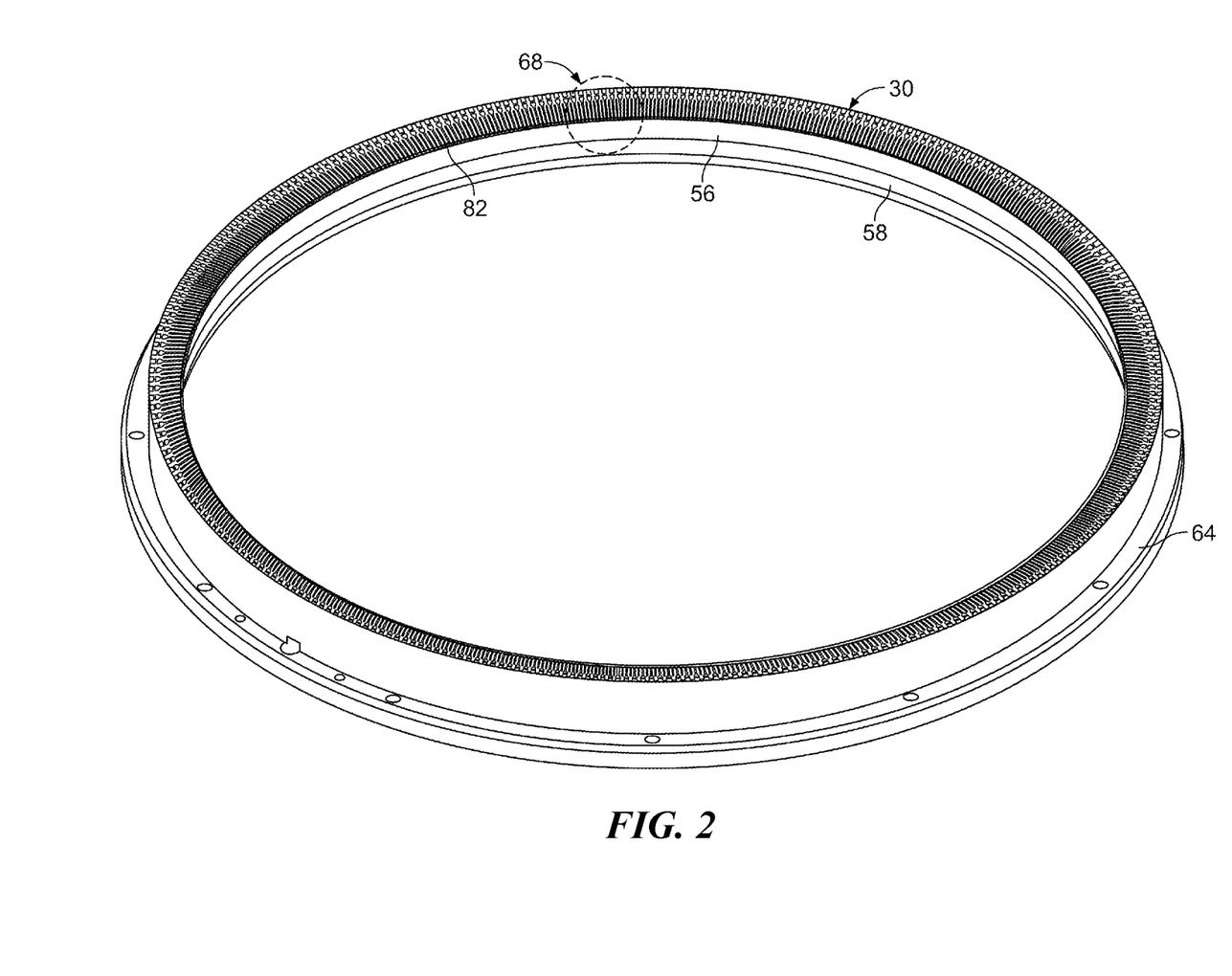
FIG. 2 is a perspective view of the contact ring shown in FIG. 1.

FIG. 2 shows the contact ring 30 separated from the rotor 24 and inverted. Accordingly, the contact fingers collectively referenced as 82 on the contact ring 30, which are shown at or near the top of the contact ring 30 in FIG. 2, are at or near the bottom end of the contact ring 30 when the contact ring 30 is installed into the rotor 24. A mounting flange 64 may be provided on the contact ring for attaching the contact ring 30 to the rotor 24 with fasteners.

Figure 3:
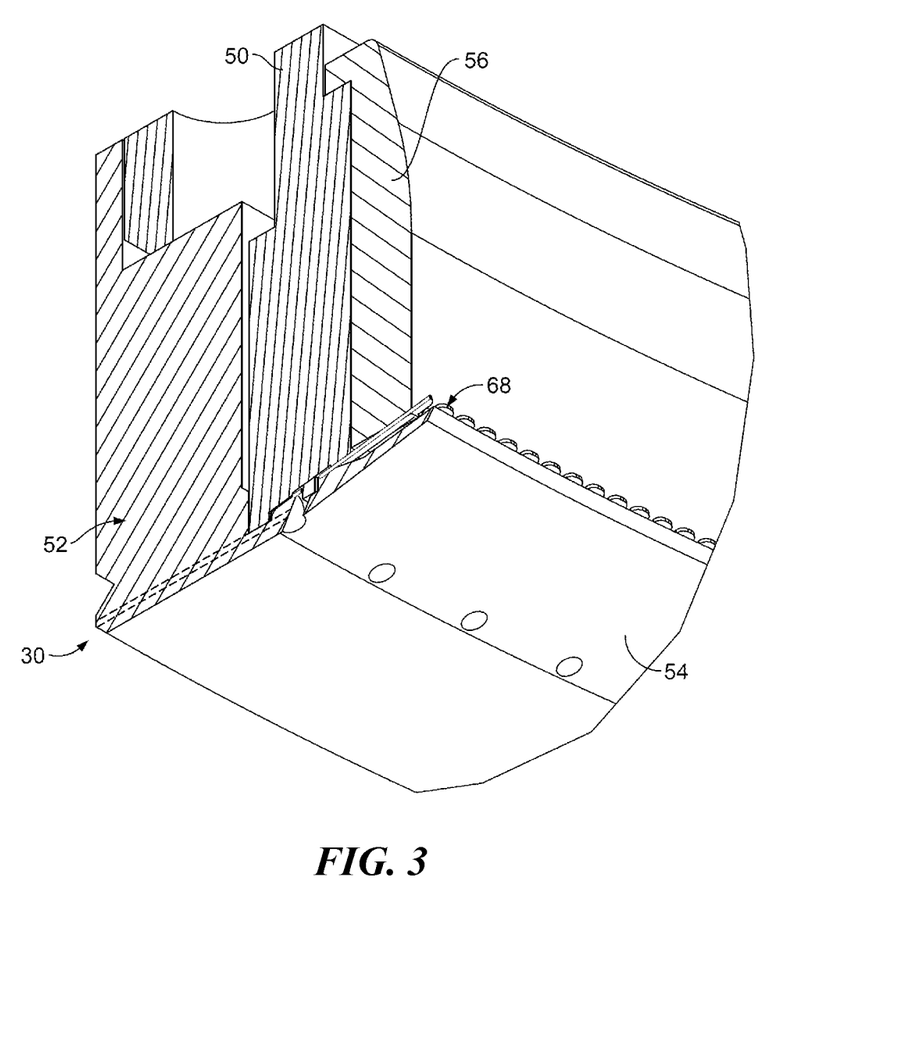
FIG. 3 is an enlarged section perspective view of the contact ring shown in FIGS. 1 and 2.
Figure 4:
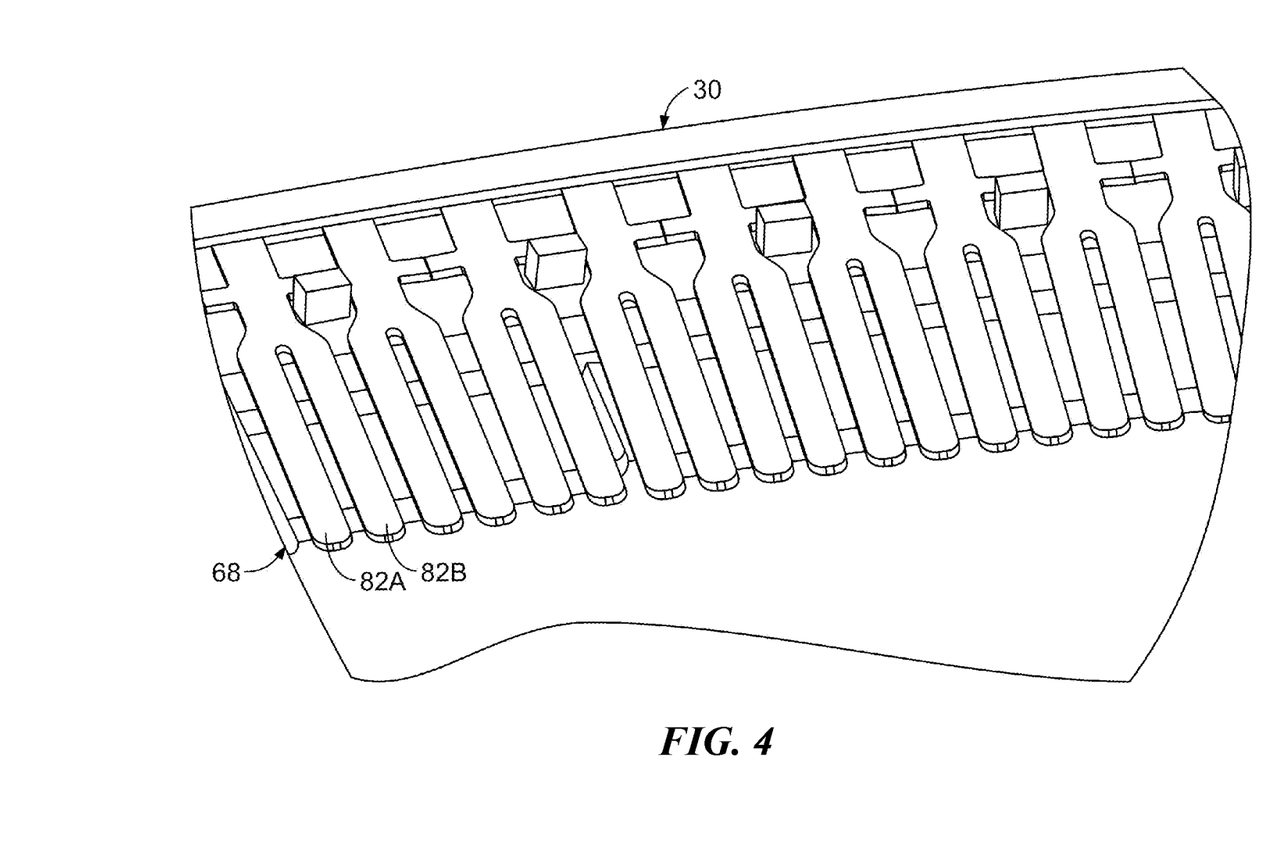
FIG. 4 is an enlarged bottom perspective detail view of the contact ring.

FIG. 3 shows a section view of the contact ring 30, with the contact ring once again in the installed upright orientation shown in FIG. 1. In this example, the contact ring 30 has a base ring 50 between an inner liner 56 and an outer shield ring 52. Referring now also to FIG. 4, lines or strips of contact fingers 82 are attached to the base ring 50, with the fingers 82 extending inwardly with each contact finger aligned on a radius of the contact ring (towards the center of the contact ring 30).

A shield 54, if used, covers part of or the entire length of contact fingers 82. The contact fingers 82 are electrically connected to the processor electrical system via wiring and/or a conductive base ring 50, and via a connector on the contact ring 30 or on the head.

Turning to FIG. 4, the contact fingers 82 may be provided on straight strips 68 of stamped metal, for ease of manufacture, with the strips 68 attached to the base ring 50 and/or the outer shield ring 52. The contact fingers 82 may be flat and rectangular, and equally spaced apart from each other. The contact ring 30 may have 300 to 1000 contact fingers, with typical designs using 360 or 720 contact fingers.

Figure 5:
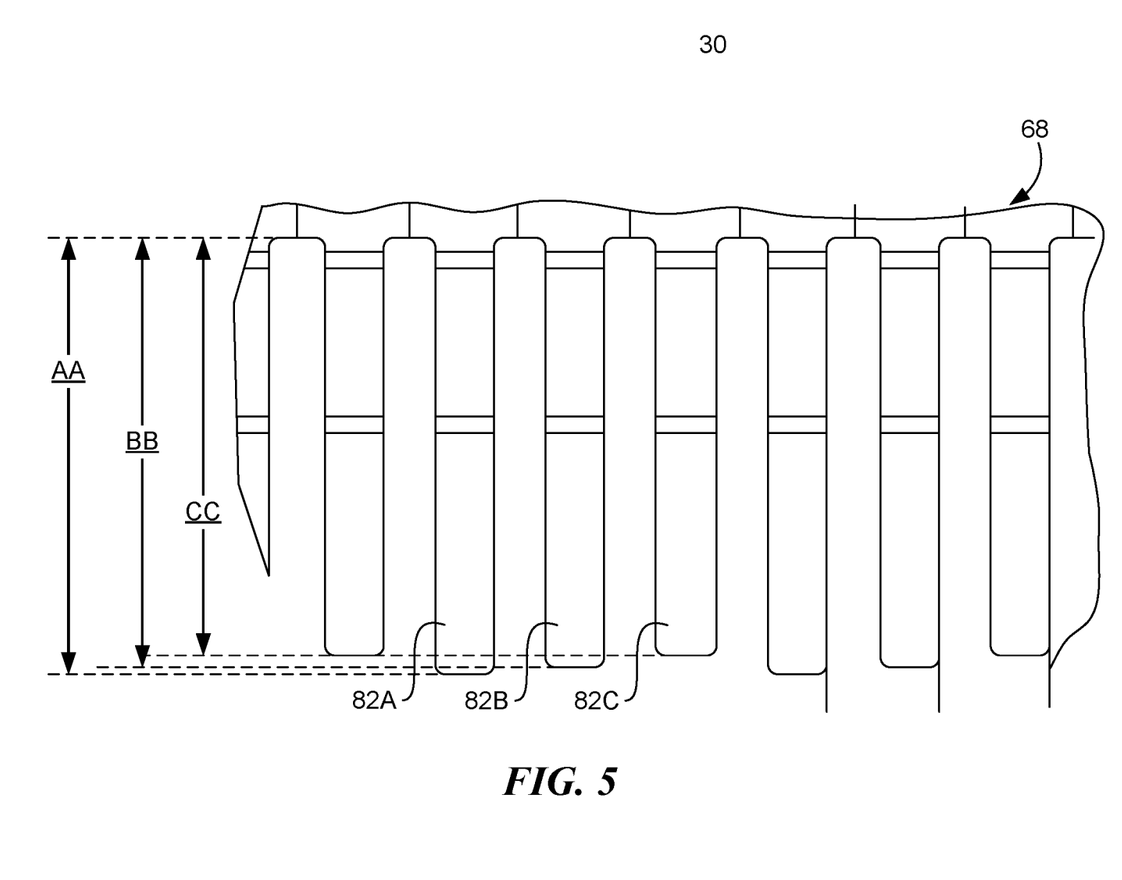
FIG. 5 is a schematic plan view of the contact fingers shown in FIGS. 2-4.
Figure 7:
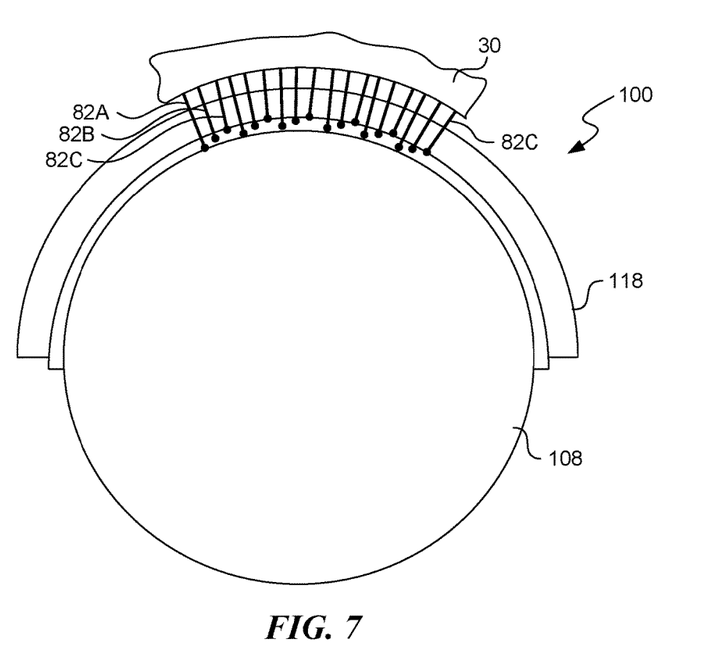
FIG. 7 is a plan view diagram illustrating contact finger landing positions.

As shown in FIG. 5, the contact fingers 82 have slightly varying lengths, so that they nominally have landing positions in the edge exclusion zone which correspondingly vary slightly in the radial direction, as shown in FIG. 7. Generally, the contact ring 30 has contact fingers 82 which extend radially inwardly from the annular base ring. The contact ring 30 may have first contact fingers 82A having a first length AA, and second contact fingers 82B having a second length BB, with length BB less than length AA typically by a range of 0.05 or 0.1 mm to 0.2 mm, although this range may vary by as much as 0.04 to 0.5 mm depending on the application. The first and second contact fingers may be arranged in an alternating pattern, with each first contact finger between two second contact fingers.

FIG. 5 shows an example including third contact fingers 82C as well, with the third contact fingers 82C having a third length CC which is less than the second length BB. In this example, the first, second and third contact fingers 82A, 82B and 82C are provided in repeating clusters of three. In this design length AA may be 0.1 mm longer than length BB, and 0.2 mm longer than length CC. Of course, the difference in length between adjacent contact fingers may be changed in different applications, with typical differences between adjacent contact fingers ranging from 0.05 to 0.2 mm. Each contact finger 82 may be a flat metal element 0.1 to 0.2 mm thick, optionally formed by stamping unstressed metal sheet stock. The contact fingers 82 may be provided in strips which are initially straight, and with the contact fingers 82 parallel to each other, and with the strips formed into one or more circumferential segments when installed into the contact ring 30 during manufacture of the contact ring 30.

In the example shown in FIG. 2, the contact ring 30 has 720 contact fingers 82, which is far more than needed for good uniformity around the circumference for typical WLP process which have a seed layer of 500 A or greater, and more typically 1000 A or greater. The large number of contact fingers on the contact ring 30 is necessary for advanced damascene-like processes on very high sheet resistance substrate. For example, when plating onto a 50 Ohm/square seed layer, having 720 contact fingers is a meaningful advantage. In contrast, when used in a WLP application, the contact ring 30 having 720 contact fingers 82 provides a surplus of contact fingers, i.e., more than actually needed. Modifying the contact finger lengths, as shown in FIG. 5, allows the contact ring to be used in a WLP application.

For example, if the expected annular edge exclusion zone of exposed seed layer is between radius=148.5 mm and 148.6 mm (on a 300 mm wafer) (i.e. 1.4 mm and 1.5 mm from the wafer edge), then the reach on adjacent fingers on the contact ring 30 may be 1.425 mm and 1.475 mm, to widen the window of contact landing positions. Every third finger may optionally have a different length, creating an even larger window (e.g., 1.4 mm; 1.45 mm; or 1.5 mm). This design doubles the workable tolerance for the contact fingers, insuring good contact on all wafers in a high volume manufacturing environment.

The contact ring 30 may also be provided with various fingers of varying lengths, so that a single contact ring can be used with various types of wafers having various dimensions of the exposed seed layer. In processing systems where the contact ring is in a wafer chuck moved into and out of the processor 20 with the wafer 100, providing the contact ring 30 as shown in FIGS. 5 and 7 can avoid the need to have different sets of chucks for different types of wafers, because the contact ring 30 is useable with wafers having varying edge exclusion zones.

Figure 6:
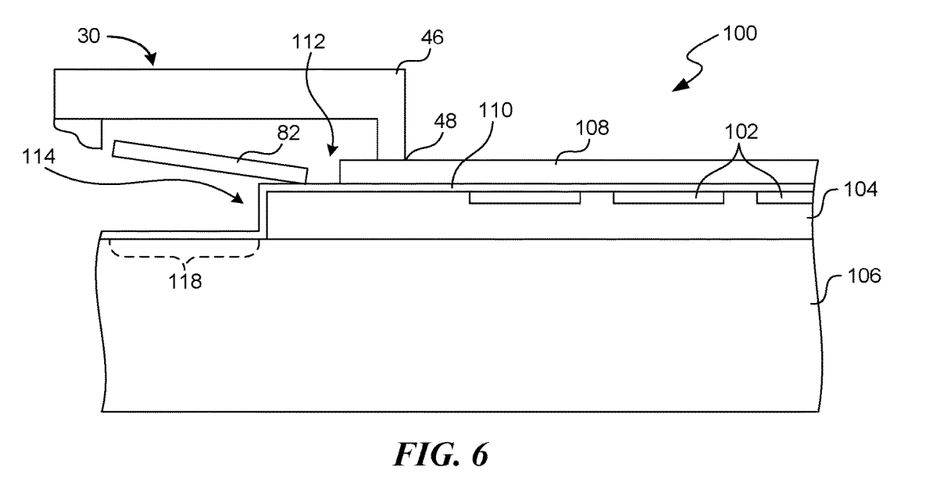
FIG. 6 is a diagram of the processor of FIG. 1 processing a reconstituted wafer.

FIG. 6 is a diagram showing a reconstituted wafer 100 having individual chips or dies 102 embedded in a layer of molding compound or epoxy 104 on a glass, plastic, ceramic or silicon substrate 106. A photoresist layer 108 covers a metal seed layer 110, except at the edge exclusion zone 112. The seed layer 110 is also applied onto the sidewall or bevel at the edge of the molding compound layer 104 and onto the edge of the substrate 106, forming a seed layer step generally shown at 114.

FIG. 6 shows a contact finger 82 on a contact ring 30 contacting the seed layer 110 at the edge exclusion zone 112, which is located above the layer of molding compound 104 and radially outside of the photoresist layer 108. In this example the contact ring also includes an annular seal 46 overlying the contact fingers and prevents the electrolyte from contacting the contact fingers 82. The seal 46 has an annular sealing surface or edge 48 adapted to seal against a wafer 100, or in this case against the photoresist layer 108 on the wafer 100, and with all contact fingers radially outside of the annular sealing surface.

The width of the edge exclusion zone 112 (on top of the step 114) is influenced by the positioning and concentricity of the photoresist layer 108 and the molding compound layer 104, and may vary by the type of reconstituted wafer 100 involved. Generally, the edge exclusion zone is 0.1 to 0.2 mm wide. The seed layer extension 118 on the substrate 106 radially outside of the layer of molding compound 104, shown in dotted lines in FIG. 6, is a contingent landing area because the seed layer 110 may not maintain continuity over the step 114.

In view of the discussion above, methods for electroprocessing a wafer having an electrically conductive edge exclusion zone, include placing the wafer into an electroprocessor having a contact ring having first contact fingers having a first length and second contact fingers having a second length less than the first length. A front side of the wafer is moved into engagement with the first and second contact fingers, with the first contact fingers contacting the front side of the wafer on a first diameter in the edge exclusion zone, and with the second contact fingers contacting the front side of the wafer on a second diameter in the edge exclusion zone, with the second diameter larger than the first diameter. The front side of the wafer is placed into contact with an electrolyte. Electric current is conducted through the electrolyte, the edge exclusion zone and the first and second contact fingers. Metal ions in the electrolyte deposit out onto the conductive edge exclusion zone and other areas electrically connected to it, forming a metal layer on the wafer.

Methods may also include aligning the wafer with the contact ring so that the second diameter is a centered in the edge exclusion zone. Relative to electroprocessing a reconstituted wafer having a seed layer on a molding compound layer, and a photoresist layer on the seed layer, the difference between the first length and the second length may be greater than the width of the edge exclusion zone. Some of the second contact fingers may contact the annular seed layer extension rather than the edge exclusion zone, depending on the accumulation of mechanical tolerances. In designs using first, second and third contact fingers, the second contact fingers can be nominally dimensioned to contact the edge exclusion zone, and the third contact fingers nominally dimension to contact the annular seed layer extension radially to the outside of the edge exclusion zone.

Thus, novel apparatus and methods have been described. Various changes and modifications may of course be made without departing from the spirit and scope of the invention. The invention, therefore, should not be limited, except to the following claims and their equivalents.

The invention claimed is:

1. An electroprocessing apparatus comprising:
   a head;
   a rotor in the head;
   an annular contact ring attachable onto the rotor;
   a frame including a vessel, with the head movable to position the annular contact ring in the vessel and out of the vessel;
   a plurality of first contact fingers aligned on the annular contact ring, with each of the first contact fingers having a first length;
   a plurality of second contact fingers aligned on the annular contact ring, with each of the second contact fingers having a second length less than the first length;
   wherein each of the plurality of first and second contact fingers are aligned on a radius of the annular contact ring and extend radially inwardly from the annular contact ring; and
   wherein the plurality of first and second contact fingers are arranged in a plurality of clusters disposed substantially around an entire diameter of the annular contact ring, with each cluster including one first contact finger and one second contact finger.

2. The apparatus of claim 1 wherein substantially every contact finger is flat and rectangular.

3. The apparatus of claim 2 wherein the plurality of first and second contact fingers are equally spaced apart.

4. The apparatus of claim 3 wherein the first length is 0.05 to 0.2 mm greater than the second length.

5. The apparatus of claim 4 with the annular contact ring having a total of 300 to 1000 contact fingers.

6. The apparatus of claim 5 further comprising an annular seal overlying the plurality of first and second contact fingers.

* * * * *